United States Patent [19]

Haraguchi et al.

[11] Patent Number: 5,127,989
[45] Date of Patent: Jul. 7, 1992

[54] METHOD OF FORMING A THIN FILM PATTERN WITH A TRAPEZOIDAL CROSS SECTION

[75] Inventors: Hiroshi Haraguchi; Hitoshi Tsuji; Yasuto Otani, all of Kawasaki; Kuniaki Kumamaru, Yokohama, all of Japan

[73] Assignee: Kabushiki Kaisha Toshiba, Kawasaki, Japan

[21] Appl. No.: 699,327

[22] Filed: May 13, 1991

[30] Foreign Application Priority Data

May 18, 1990 [JP] Japan ................. 2-130042

[51] Int. Cl.$^5$ .................. H01L 21/306; B44C 1/22
[52] U.S. Cl. ................... 156/643; 156/657; 156/659.1; 156/662; 430/313
[58] Field of Search ............ 156/643, 646, 657, 659.1, 156/661.1, 662; 430/313, 318

[56] References Cited

U.S. PATENT DOCUMENTS

| | | | |
|---|---|---|---|
| 4,378,383 | 3/1983 | Moritz | 427/96 |
| 4,764,245 | 8/1988 | Grewal | 156/643 |
| 5,007,982 | 4/1991 | Tsou | 156/643 |
| 5,007,984 | 4/1991 | Tsutsumi et al. | 156/659.1 X |

FOREIGN PATENT DOCUMENTS 0057738  8/1982  European Pat. Off.
3615519  11/1987  Fed. Rep. of Germany.

OTHER PUBLICATIONS

IBM Technical Disclosure Bulletin, vol. 32, No. 4A, Sep. 1989, pp. 55–57; "Novel Technique for Producing Positive Sloped Contact Vias Using Negatively Sloped Resist Walls".

Extended Abstracts, vol. 87, No. 2, 1987, pp. 676–677; "Photolithography for Dry Metal Etch", Holland et al.

Extended Abstracts, vol. 90, No. 1, May 11, 1990, pp. 217–218; "High Selectively SiO$_2$ Etching and Taper Angle Control by Wafer Temperature Control RIE", Toyosato et al.

Journal of Physics E. Scientific Instruments, vol. 19, No. 9, Sep. 1986, pp. 654–667; "Instrument Science and Technology: The Application of Photolithography to the Fabrication of Microcircuits", Stevenson et al.

Microelectronic Engineering, vol. 9, No. 1–4, May 1989, pp. 41–46; "Wide Latitude Image Reversal Process for 4M and 16M Drams", Talor et al.

IBM Technical Disclosure Bulletin, vol. 28, No. 11, Apr. 1986, pp. 4805–4806; "Dyed Resist to Enhance Undercut Angles Attainable on Reduction Projection Printers".

Journal of the Electrochemical Society, vol. 135, No. 2, Feb. 1988, pp. 471–476; "Contrast Enhancing Additives for Positive Photoresist", Pampalone et al.

*Primary Examiner*—William A. Powell
*Attorney, Agent, or Firm*—Finnegan, Henderson, Farabow, Garrett and Dunner

[57] ABSTRACT

The present invention provides a method of forming a thin film pattern with a trapezoidal cross section. In this method, a resist pattern with an inverted-trapezoidal cross section is formed on a thin film. Using the resist pattern with the inverted-trapezoidal cross section as a mask, the thin film is dry-etched. A resist pattern is left with the resist pattern used as a mask. The resist pattern has a trapezoidal cross section.

13 Claims, 7 Drawing Sheets

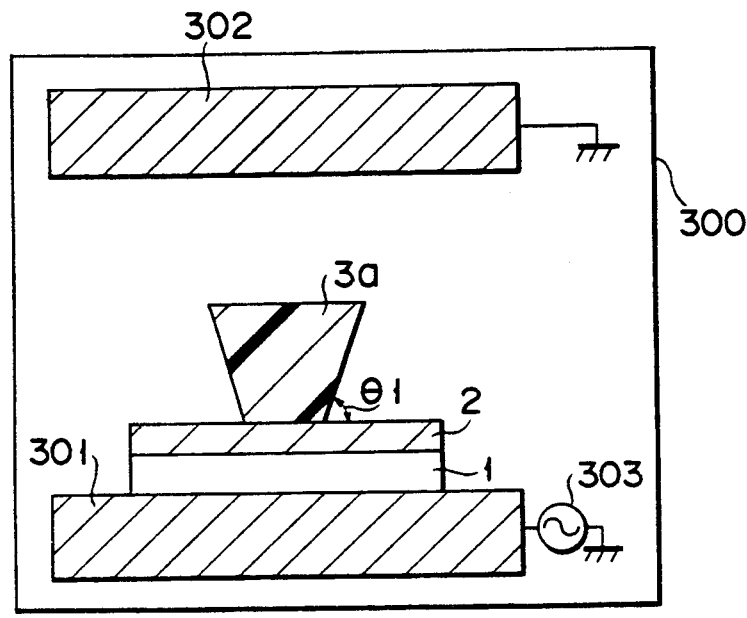
F I G. 5A
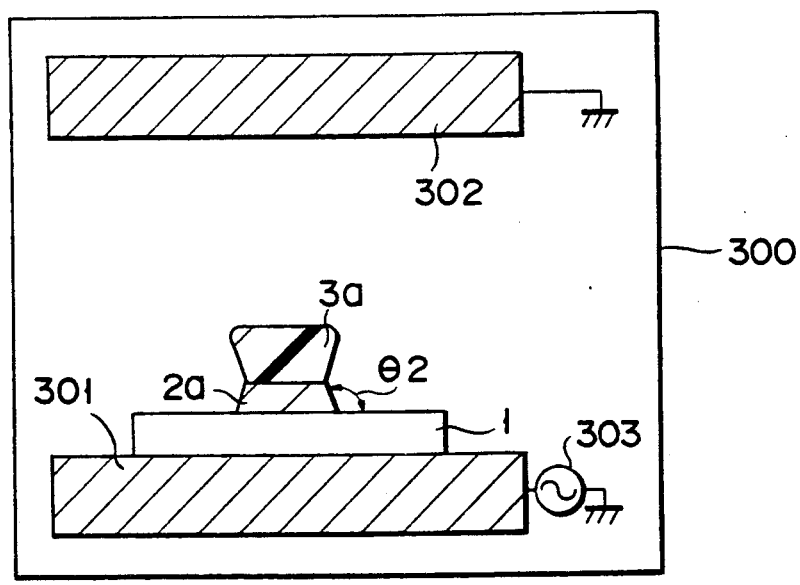
F I G. 5B

METHOD OF FORMING A THIN FILM PATTERN WITH A TRAPEZOIDAL CROSS SECTION

BACKGROUND OF THE INVENTION

1. Field of the Invention

The present invention relates generally to a method of forming a semiconductor device, and more particularly to a method of performing a photoetching process selectively on such thin films as a polysilicon film, an insulating film and a metallic film.

2. Description of the Related Art

In accordance with recent development in miniaturization of semiconductor devices, a dry etching technique is widely used in the process of etching thin films.

The dry etching technique is generally classified into isotropic etching such as CDE (Chemical Dry Etching) and anisotropic etching such as RIE (Reactive Ion Etching). In particular, RIE is widely used since it allows a photoresist pattern to be reproduced with fidelity on a thin film to be etched.

In the isotropic etching, a side face of a thin film pattern is formed substantially vertical to a substrate.

However, when a new thin film is formed over the thin film pattern having the substantially vertical side face, the "step coverage" of the new thin film is deteriorated. In other words, the new thin film has a difference between film thickness t1 at its flat area and film thickness t2 at its side area. The relationship between t1 and t2 is:

$$t1 < t2$$

Consequently, in the isotropic etching, that part of the thin film, which corresponds to $\Delta t (= t2 - t1)$.

The above problem will now be explained with reference to the accompanying drawings.

FIGS. 1A to 1D are cross-sectional views illustrating the steps of a process for fabricating a conventional semiconductor device.

As shown in FIG. 1A, a first polysilicon layer 2, which is undoped or has a low impurity concentration, is formed on a base layer 1 (a silicon substrate or a silicon oxide film). A photoresist is coated over the first polysilicon layer 2. The photoresist is selectively etched by means of photoetching, thus obtaining a photoresist pattern 3B.

Referring to FIG. 1B, the polysilicon layer 2 is selectively etched by means of RIE (one of isotropic etching techniques), using the photoresist pattern 3B as a mask. Thus, polysilicon patterns 2A and 2B are obtained.

In the step of FIG. 1C, a second polysilicon layer 4 having a high impurity concentration is formed over the base layer 1 and polysilicon patterns 2A and 2B.

In FIG. 1D, a photoresist is coated over the second polysilicon layer 4, and the photoresist is selectively etched by means of photoetching, thereby obtaining a photoresist pattern 5. Using the pattern 5 as a mask, the second polysilicon layer 4 is selectively etched by means of RIE and a polysilicon pattern 4A is obtained.

In the step of FIG. 1D, the second polysilicon 4 is left on the side walls of the polysilicon patterns 2A and 2B.

In the resultant condition, impurities move from the second polysilicon layer 4 with high impurity concentration to the polysilicon patterns 2A and 2B with low impurity concentration. Consequently, the impurity concentration of the polysilicon patterns 2A and 2B varies. For example, where the polysilicon patterns 2A and 2B constitute resistors of an integrated circuit, the resistance values of the resistors vary and the characteristic of the integrated circuit changes.

In order to solve the above problem, it is thought that the second polysilicon layer 2 on the side walls of the polysilicon patterns 2A and 2B are entirely removed. In this case, however, the base layer 1 is over-etched and is damaged by RIE. As a result, the reliability of the semiconductor device is deteriorated.

SUMMARY OF THE INVENTION

The present invention has been made in consideration of the above circumstances, and an object of the invention is to provide a method of fabricating a semiconductor device wherein no portion of a new thin film is left on the side wall of a thin film pattern formed by isotropic etching.

Another object of the invention is to provide a method of forming a thin film pattern with a trapezoidal cross section.

In order to achieve the above objects, there is provided a method of forming a thin film pattern, comprising the steps of: forming a thin film on a major surface of a substrate; forming a resist pattern, which has an inverted-trapezoidal cross section, on the thin film; and dry-etching the thin film selectively, with the resist pattern having the inverted-trapezoidal cross section employed as a mask, thereby forming a thin film pattern.

By this method, there is obtained a thin film pattern with a trapezoidal cross section.

Since the thin film pattern has a trapezoidal cross section, it is possible that a new thin film formed on the thin film pattern has a uniform thickness. Thus, even if a new thin film is formed by isotropic etching, no portion of the new thin film is left on the side wall of the thin film pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are cross-sectional views illustrating the steps of a process for fabricating a semiconductor device according to a fourth embodiment.

DETAILED DESCRIPTION OF THE PREFERRED EMBODIMENTS

Embodiments of the present invention will now be described with reference to the accompanying drawings.

First Embodiment

FIGS. 2A to 2F are cross-sectional views illustrating the steps of a process for fabricating a semiconductor device according to a first embodiment.

Figure 1A:
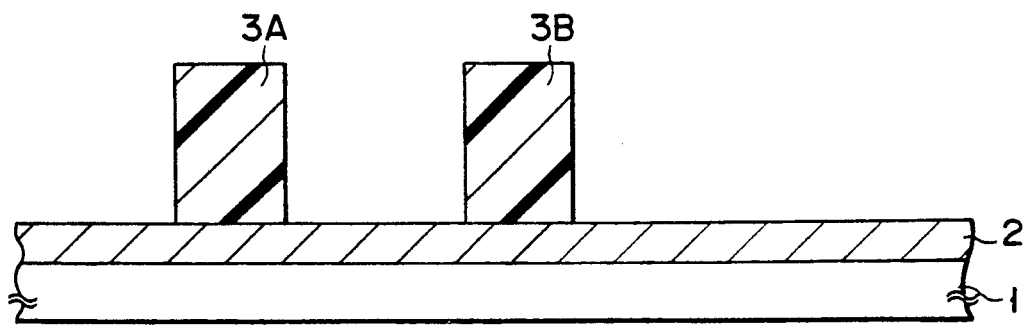
FIGS. 1A to 1D are cross-sectional views illustrating the steps of a process for fabricating a conventional semiconductor device.
Figure 1B:
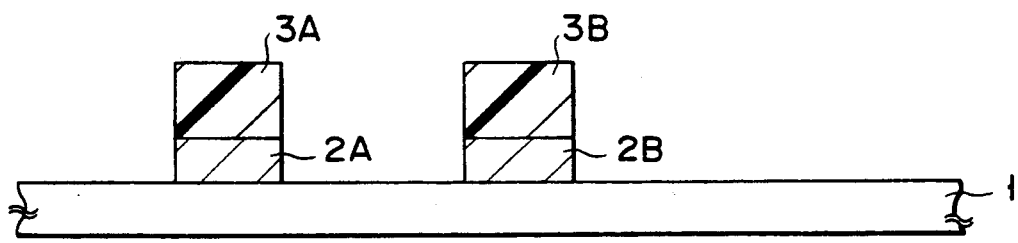
Figure 1C:
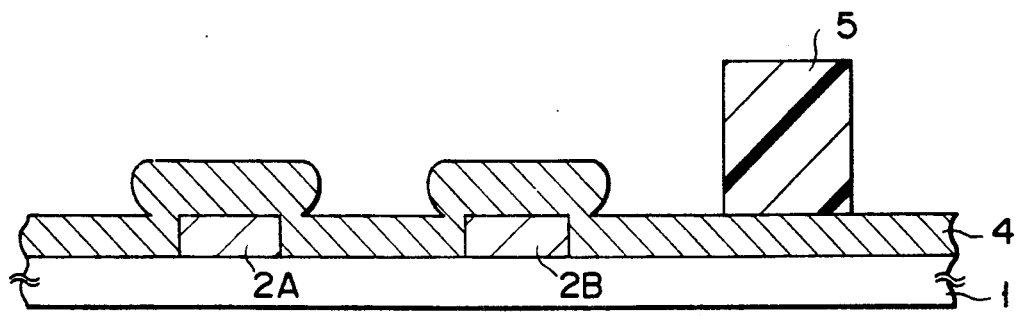
Figure 1D:
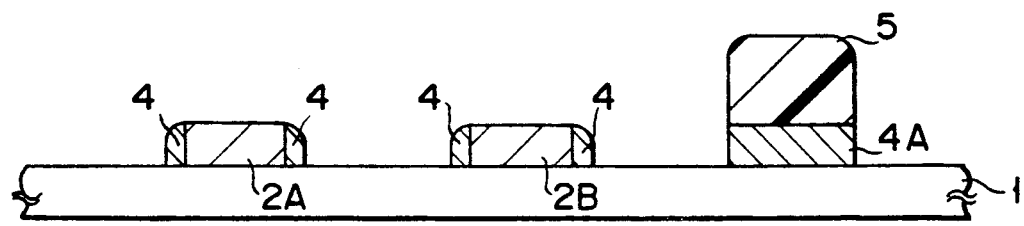
Figure 2A:
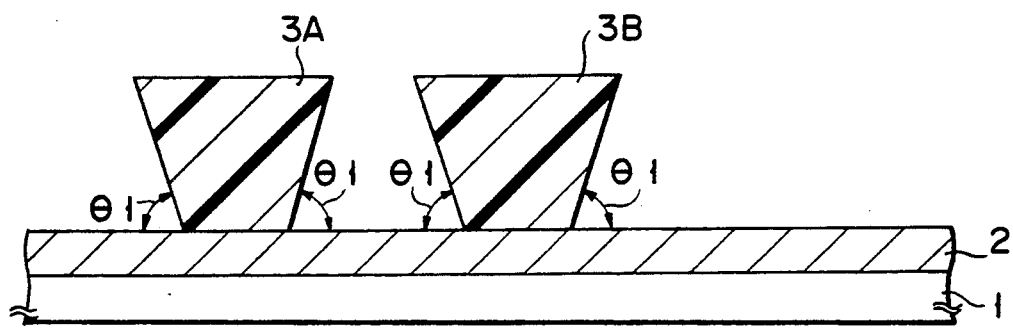
FIGS. 2A to 2D are cross-sectional views illustrating the steps of a process for fabricating a semiconductor device according to a first embodiment of the invention.

Referring to FIG. 2A, a first polysilicon layer 2, which is undoped or has a low impurity concentration, is formed on a base layer 1 (e.g. silicon oxide film or a silicon substrate). A positive type photoresist is coated on the polysilicon layer 2. The photoresist is selectively etched by means of photoetching. In the step of photoetching, an image reverse method is employed. The image reverse method will be described in detail in connection with the second and third embodiments. The angle $\theta 1$ defined by the upper surface of the first polysilicon layer 2 and each side wall of the resist patterns 3A and 3B is acute and less than 90°. Each of the resist patterns 3A and 3B has an inverted-trapezoidal cross section.

Figure 2B:
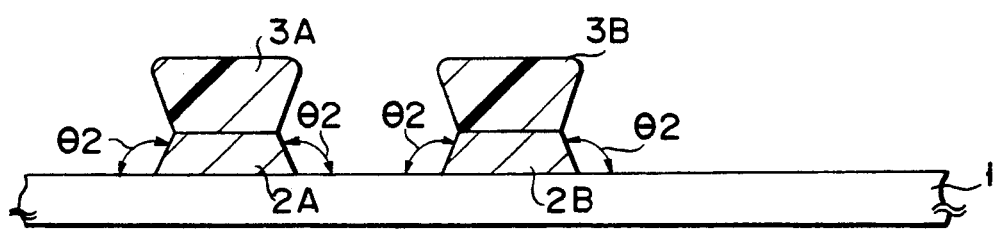
Figure 2C:
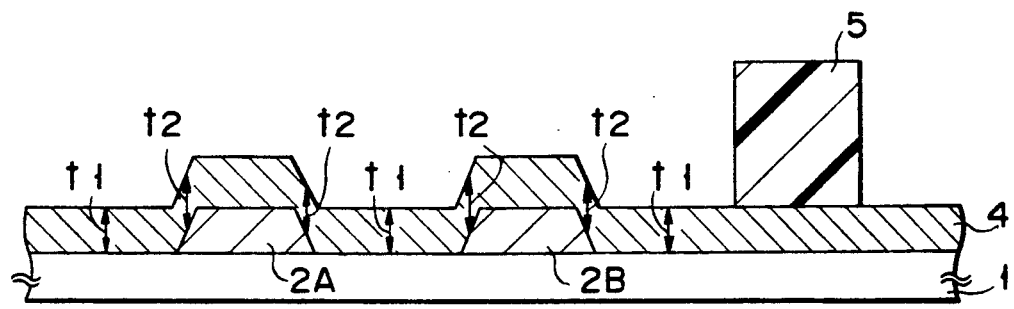

In the subsequent step of FIG. 2B, using the resist patterns 3A and 3B as a mask, the first polysilicon layer 2 is selectively etched by means of dry etching (e.g., RIE). The angle $\theta 2$ defined by the upper surface of the base layer 1 and each side wall of the silicon patterns 2A and 2B is obtuse and more than 90°. Each of polysilicon patterns 2A and 2B has a trapezoidal cross section. The patterns 2A and 2B constitute, for example, resistors of an integrated circuit.

After the photoresist pattern 3A and 3B are removed, a second polysilicon layer 4 having a high impurity concentration is formed over the base layer 1 and polysilicon patterns 2A and 2B. In this case, the thickness of the second polysilicon layer 4 is uniform. Specifically, the thickness t1 of the second polysilicon layer 4 on the base layer 1 and the thickness t2 of the second polysilicon layer 4 on the side walls of the polysilicon patterns 2A and 2B have the relationship:

$$t1"b \approx t2$$

This is because the cross section of each of polysilicon patterns 2A and 2B is trapezoidal and the side wall thereof is inclined.

Then, a photoresist is coated on the second polysilicon layer 4, and the photoresist is selectively etched by means of conventional photoetching, thereby obtaining a photoresist pattern 5.

Figure 2D:
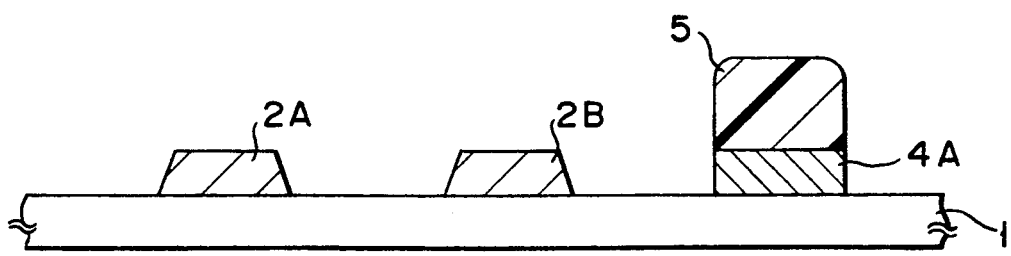

In the step of FIG. 2D, using the photoresist pattern 5 as a mask, the second polysilicon layer 4 is selectively etched by means of isotropic etching (e.g. RIE). Thus, the second polysilicon layer 4 is completely removed, without being left on the side walls of the polysilicon patterns 2A and 2B, and without over-etching. A polysilicon pattern 5 is obtained at the region masked by the photoresist pattern 5. The polysilicon pattern 5 constitutes, for example, a wiring layer in an integrated circuit or a gate electrode of a transistor.

According to the above method of manufacturing the semiconductor device, a thin film pattern having a trapezoidal cross section can be formed, and a new thin film having a uniform thickness can be formed on this thin film pattern.

The above method has the following principal advantages:

1) For example, when a second thin film (conductive film) is formed over a first thin film, the second thin film on the side wall of the first thin film can be removed only by isotropic etching the second thin film.

2) If a wiring thin film layer with a trapezoidal cross section is formed, the step coverage of an insulating layer covering the wiring layer can be improved.

3) When a new wiring layer is formed over the wiring thin film layer, with an insulating layer interposed therebetween, the step coverage of the new wiring layer can also be improved. Thus, the stepwise severing of the new wiring layer can be prevented.

Second Embodiment

A description will now be given of a second embodiment of the invention wherein a first method of controlling the angle of the side wall of a thin film pattern with a trapezoidal cross section is employed.

FIGS. 3A to 3F are cross-sectional views illustrating the steps of a process for fabricating a semiconductor device according to the second embodiment.

Figure 3A:
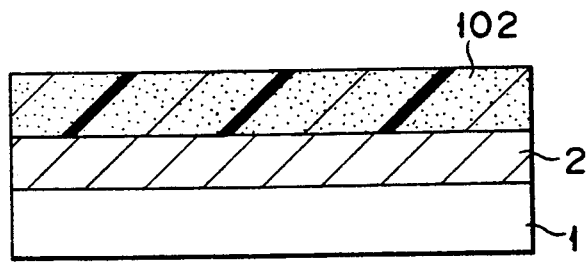
FIGS. 3A to 3F are cross-sectional views illustrating the steps of a process for fabricating a semiconductor device according to a second embodiment.

Referring to FIG. 3A, a first polysilicon layer 2 is formed on a substrate 1. A positive type photoresist 102 with a thickness of about 1.0 μm to 2.0 μm is coated on the polysilicon layer 2. Then, a prebaking process is carried out. In the positive type photoresist 102, the base polymer is, for example, phenol novolak resin, and diazo naphtho-quinone. The photoresist 102 contains, for example, azo dye.

Figure 3B:
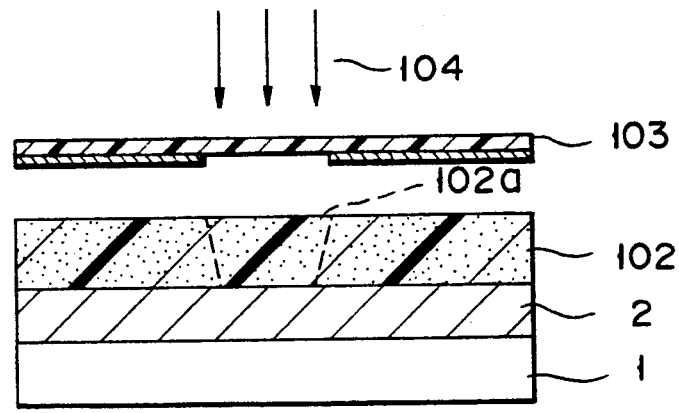

Using a stepper (not shown), the positive type photoresist 102 is selectively irradiated with ultraviolet 104, with a reticle employed as a mask, as shown in FIG. 3B. The condition for the selective exposure is that, for example, a g-ray (wavelength: 436 nm; g-ray is generally called "ultraviolet") is used and the quantity of ultraviolet is 300 mJ/cm². The photoresist 102 is subjected to selective exposure, and a selectively photo-sensitized region 102a is obtained. Alkalisoluble indene carboxylic acid is produced in the photo-sensitized region 102a.

Figure 3C:
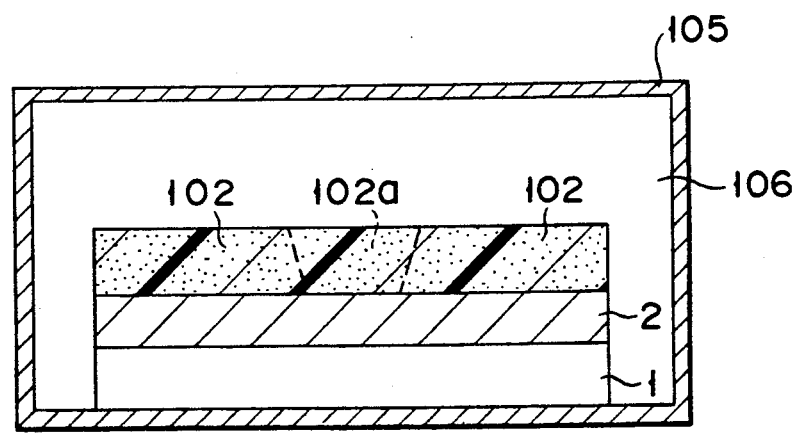

Subsequently, as shown in FIG. 3C, the substrate 1 coated with photoresist 102 is put in heat-treatment furnace 105. In the furnace 105, the substrate 1 is heated in an ammonia gas atmosphere 106. The heat treatment is performed at a temperature of 95° to 120° C. for 75 minutes. At the photo-sensitized region, the indene carboxylic acid is crosslinked and alkali-insoluble indene is produced.

This step is called an image reverse heat treatment step.

Figure 3D:
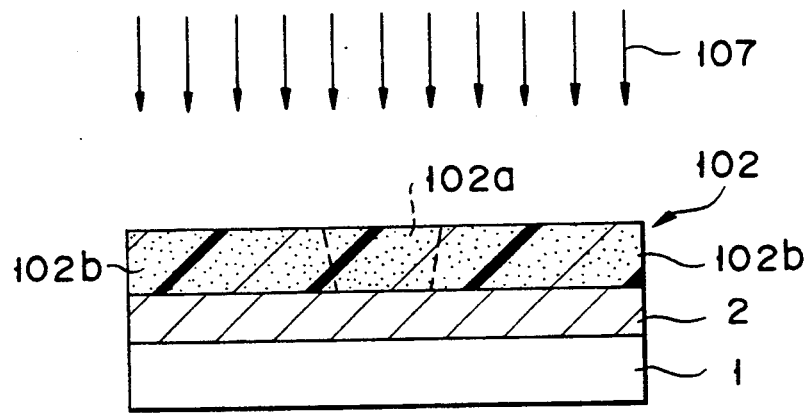

In the step of FIG. 3D, using an aligner (not shown), the entire surface of the photoresist 102 is irradiated with ultraviolet 107, thus effecting total surface exposure. For example, for the total surface exposure, ultraviolet (wavelength: 200 to 450 nm) is employed in a quantity of 0.36 mJ/cm².

Non-sensitized region 102b of the photoresist 102 is newly sensitized by the total surface exposure, and alkali-soluble indene carboxylic acid is produced.

Figure 3E:
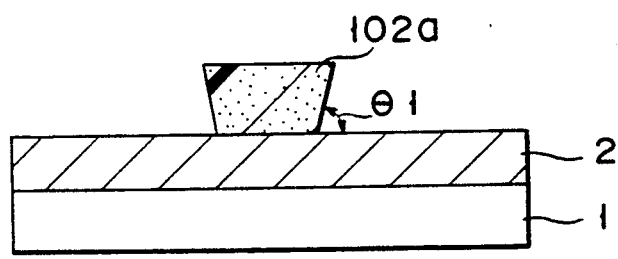

In the step illustrated in FIG. 3E, the substrate 1 is immersed in an alkali water solution, and the photoresist 102 is developed. Consequently, the region 102b where indene carboxylic acid is produced is removed and the region 102a where indene is produced remains. In this way, regarding the positive type photoresist 102, the region 102a sensitized in the selective exposure step (first exposure) described with reference to FIG. 2B is left, and the image is reversed, compared to the normal positive type resist. This type of photoetching is called an image reverse method.

As is shown in FIG. 3E, regarding the photoresist pattern 102a obtained by the image reverse method, an acute angle $\theta1$ is defined by the side wall of the pattern 102a and the upper surface of the polysilicon layer 2. In addition, the photoresist pattern 102a has an inverted-trapezoidal cross section.

In the following step illustrated in FIG. 3F, using the photoresist pattern 102a as a mask, isotropic etching (e.g. RIE) is employed to etch the polysilicon layer 2. Thus, like in the first embodiment, a polysilicon pattern 2a having a trapezoidal cross section is obtained.

According to this second embodiment, an azo dye is contained in the photoresist 102. Since the photoresist 102 contains the azo dye, the ultraviolet transmissivity decreases, and the quantity of ultraviolet reaching the deepest part of the photoresist 102 decreases. Where the quantity of light reaching the deepest part decreases, the sensitized part 102 is tapered. By changing the quantity of dye in the photoresist 102, the degree of tapering of the sensitized part 102a varies. In other words, the angle $\theta1$ of the inclined side wall of the photoresist pattern 102a varies. For example, if a large quantity of dye is contained in the resist 102 and the image reverse method is carried out, the angle $\theta1$ is shifted from 90° towards 0°. If the quantity of dye is small, the angle $\theta1$ approaches 90°.

If the inclination angle $\theta1$ of the side wall of the resist pattern 102a varies, the angle $\theta2$ of the side wall of the polysilicon pattern 2a obtained by the method of the present invention also varies. Taking advantage of this phenomenon, the angle $\theta2$ of the side wall of the polysilicon pattern 2a can be controlled. For example, if the angle $\theta1$ approaches 90°, the angle $\theta2$ also approaches 90°. If the angle $\theta1$ approaches 0°, the angle $\theta2$ also approaches 180°.

More specifically, the inclination angle $\theta2$ of the side wall of the polysilicon pattern 2a can be varied by altering the quantity of dye contained in the photoresist 102.

Accordingly, since the shape of the cross section of the polysilicon pattern 2a can be freely controlled, the thin film pattern can have a wide margin. The method of controlling the cross sectional shape of the resist pattern is not limited to the changing of dye quantity in the photoresist 102; the quantity of ultraviolet 104 may be altered in the selective exposure process illustrated in FIG. 3B.

For example, if the quantity of ultraviolet 104 is decreased, the quantity of ultraviolet reaching the deepest part of the photoresist 102 decreases. Utilizing this fact, the inclination angle $\theta1$ is controlled, as stated above; thus, the inclination angle $\theta2$ of the side wall of the thin film pattern can be controlled.

Other methods of altering the angle $\theta1$ of the side wall of the resist pattern are to change the temperature and/or time for the heat treatment described with reference to FIG. 3C, or to change the exposure amount in the total surface exposure step described with reference to FIG. 3D. As a result, the cross sectional shape of the thin film pattern can be changed.

Third Embodiment

A third embodiment of the invention, wherein an image reverse resist is employed, will now be described.

FIGS. 4A to 4F are cross-sectional views illustrating the steps of a process for fabricating a semiconductor device according to the third embodiment.

Figure 4A:
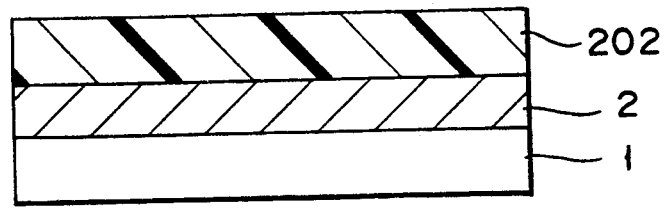
FIGS. 4A to 4F are cross-sectional views illustrating the steps of a process for fabricating a semiconductor device according to a third embodiment.

Referring to FIG. 4A, a polysilicon layer 2 is formed on a substrate 1. An image reverse resist 202 is coated on the polysilicon layer 2. An example of the image reverse resist 202 is AZ5214E (HOECHST JAPAN Corp.). After the image reverse resist 202 is coated, prebaking is carried out.

Figure 4B:
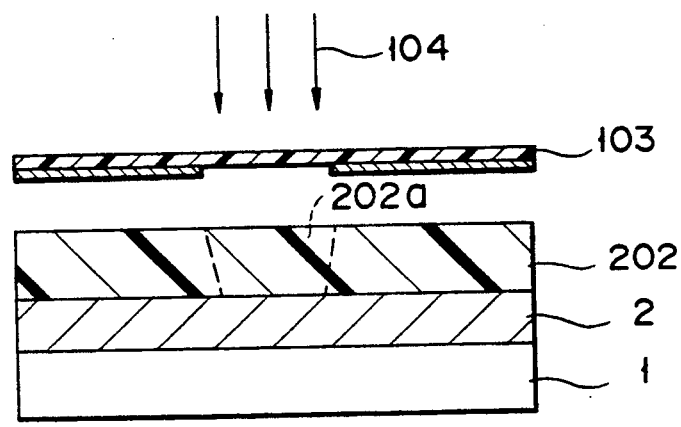

As is shown in FIG. 4B, the photoresist 202 is selectively exposed by a method similar to that illustrated in FIG. 3B, thus obtaining a photosensitized region 202a.

The condition for selective exposure is the use of g-rays in a quantity of 500 mJ/cm$^2$.

Figure 4C:
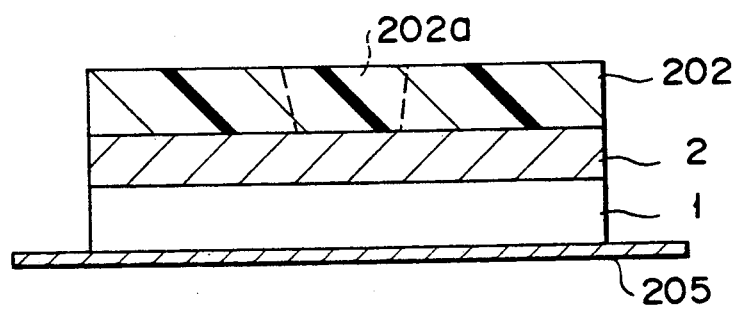

In the step illustrated in FIG. 4C, the substrate 1 is placed on the hot plate 205, and the substrate 1 is heated to reverse an image. The heat treatment is performed under the condition that the temperature is 95° to 120° C. and the time is 1 to 5 minutes. By the heat treatment, alkali insoluble indene is produced in the sensitized region 202a.

In the third embodiment, the image reverse resist is used as photoresist; thus, the heat treatment may not be carried out, for example, in an ammonia atmosphere.

Figure 4D:
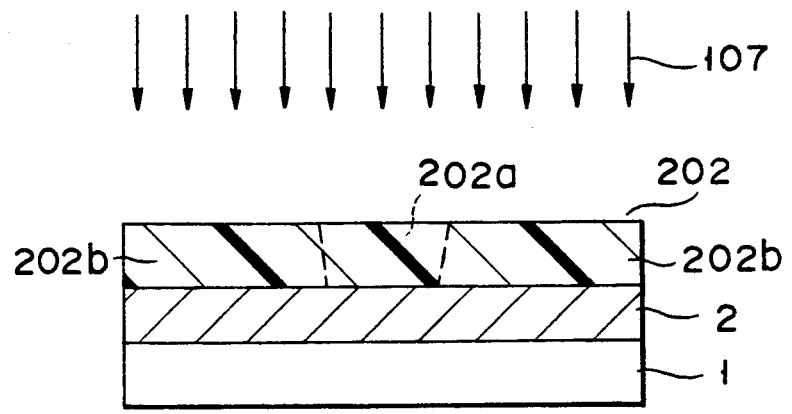

Subsequently, as shown in FIG. 4D, the total surface of the photoresist 202 is exposed in the same method as described with reference to FIG. 3D, thus forming a new sensitized region 202b.

The condition for the total surface exposure is the use of ultraviolet (200 to 450 nm) in a quantity of 0.36 mJ/cm$^2$.

Figure 4E:
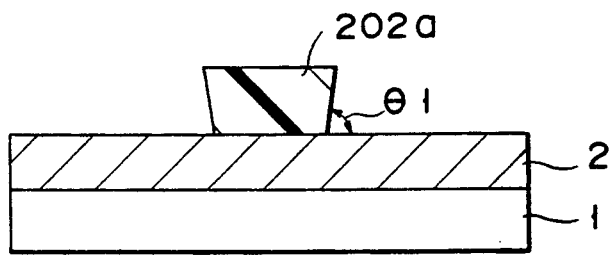

In the step illustrated in FIG. 4E, the photoresist 202 is developed in the same method as described by referring to FIG. 3E, thereby obtaining a photoresist pattern 202a.

Figure 3F:
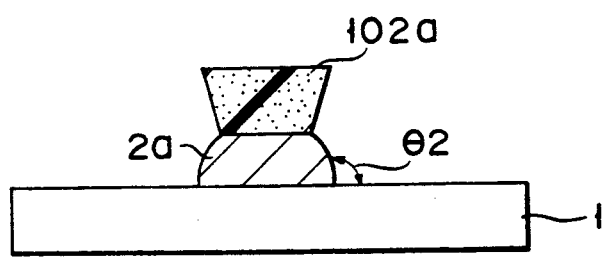
Figure 4F:
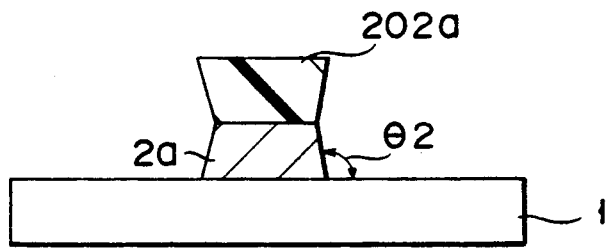

In the step of FIG. 4F, using the photoresist pattern 202a as a mask, the polysilicon layer 2 is etched by isotropic etching (e.g. RIE), in a manner similar to that illustrated in FIG. 3F, thus obtaining a polysilicon pattern 2a with a trapezoidal cross section.

According to the above method of fabricating the semiconductor device, the image reverse resist 202 is used as photoresist, and therefore the time required for heat treatment illustrated, for example, in FIG. 3C, can be reduced.

In the third embodiment, too, it is possible to add a dye to the image reverse photoresist 202 and adjust the quantity of added dye, thereby controlling the inclination angle $\theta1$ of the side wall of the photoresist pattern 202a. By controlling the angle $\theta1$, the inclination angle $\theta2$ of the side wall of the thin film pattern 2a can be controlled.

In the selective exposure step shown in FIG. 4B, if the exposure amount of ultraviolet 104 is controlled, the inclination angle $\theta1$ of the side wall of resist pattern 202a can be controlled and accordingly the angle $\theta2$ of the side wall of the thin film pattern can also be controlled.

Fourth Embodiment

A fourth embodiment of the invention, wherein a second method of controlling the inclination angle of the side wall of a thin film pattern with a trapezoidal cross section is employed, will now be described.

FIGS. 5A to 5F are cross-sectional views illustrating the steps of a process for fabricating a semiconductor device according to the fourth embodiment.

Referring to FIG. 5A, a parallel plate type RIE apparatus 300 has a lower electrode 301, to which an AC source 303 is connected, and an upper electrode 302 serving as an ion generating source facing the lower electrode 301. A substrate 1 having a photoresist pattern 3a is placed on the lower electrode 301. In the fourth embodiment, the frequency of the RF generator 303 is about 200 KHz, and the thickness of the resist pattern 3a is about 1.5 μm.

In this state, ions are emitted from the upper electrode 302 to etch a polysilicon layer 2 selectively, using the resist pattern 3a as mask. FIG. 5B shows the state in which the etching has been completed.

In the fourth embodiment, when ions are radiated, the temperature of the upper electrode 302 is made to differ from that of the lower electrode 301, thus providing a temperature gradient therebetween.

By virtue of the temperature gradient, the inclination angle θ2 of the side wall of the polysilicon pattern 2a can be controlled.

According to experimental data, where the inclination angle θ1 was 108° and the temperature of both the upper and lower electrodes 302 and 301 was set at 50° C., the inclination angle θ2 was 113°.

Where the inclination angle θ1 was 108° and the temperature of the upper electrode 302 was set at 60° C. and that of the lower electrode 301 was set at 20° C., the inclination angle θ2 was 118°. In this manner, when the temperature gradient of 40° C. was provided between the upper electrode 302 and the lower electrode 301, the inclination angle θ2 changed by about 5° C.

Where the inclination angle θ1 was 112° C. and the temperature of both the upper and lower electrodes 302 and 301 was set at 50° C., the inclination angle θ2 was 127° C.

In addition, where the inclination angle θ1 was 112° C. and the temperature of the upper electrode 302 was set at 60° C. and that of the lower electrode 301 was set at 20° C., the inclination angle θ2 was 130°.

As has been described above, by providing a temperature gradient between the upper electrode 302 and the lower electrode 301, the inclination angle θ2 of the side wall of the thin film pattern 2a can be controlled.

In the fourth embodiment, it is desirable that the temperature gradient be provided such that the temperature of the lower electrode 301 be lower than that of the upper electrode 302. By doing this, the acceleration of ions can be enhanced and the inclination angle θ2 can be further changed.

In the first to fourth embodiments, the thin film pattern was formed of an undoped or low-impurity-concentration polysilicon; however, any type of thin film capable of being subjected to isotropic etching may be employed (e.g. a high-impurity-concentration polysilicon, a silicon oxide film, a metallic film of aluminum, etc.).

Other thin film formed over the thin film pattern is not limited to the high-impurity concentration polysilicon; for example, any type of thin film capable of being subjected to isotropic etching may be employed (e.g. an undoped polysilicon, a silicon oxide film, a metallic film of aluminum, etc.).

According to this invention, the thin film can be etched by means of dry etching as much as possible, without lowering the reliability of the semiconductor device. Accordingly, semiconductor devices having fine element structure can be fabricated with a high yield, and this contributes to the development in miniaturization of element structure.

At present, a minimum rule of a resist pattern obtained by an image reverse method is about 0.8 μm. It is thought, however, that the minimum rule decreases to less than 0.8 μm, for example, a half micron or a quarter micron. Needless to say, the present invention is applicable, even if the minimum rule of a resist pattern having an inverted-trapezoidal cross section becomes a half micron or a quarter micron.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a thin film pattern, comprising the steps of:

forming a thin film on a major surface of a substrate;

forming a resist pattern, which has an inverted-trapezoidal cross section, on the thin film; and dry-etching the thin film selectively, with the resist pattern having the inverted-trapezoidal cross section employed as a mask, thereby forming a thin film pattern.

2. The method according to claim 1, wherein the dry etching is isotropic etching.

3. The method according to claim 2, wherein the isotropic etching is RIE.

4. The method according to claim 3, wherein the RIE is performed with use of a parallel-plate reactor capable of independently controlling the temperature of an upper electrode and the temperature of a lower electrode.

5. The method according to claim 1, wherein the resist pattern having an inverted-trapezoidal cross section is obtained by the steps of:

forming a resist film on the thin film;

exposing the resist film selectively, and forming a photo-sensitized region in the resist film, the photo-sensitized region being soluble in a developing liquid;

subjecting the resist film having the photo-sensitized region to heat treatment, thereby producing a substance in the photo-sensitized region, which substance is soluble in the developing liquid;

exposing the total surface of the resist film and forming another photo-sensitized region, which is soluble in the developing liquid, in those regions of the resist film which are other than the photo-sensitized region; and removing said other photo-sensitized region by use of the developing liquid.

6. The method according to claim 5, wherein the resist film formed on the thin film is a novolak-based positive resist; and the step of subjecting the resist film having the photo-sensitized region to heat treatment, thereby producing a substance in the photo-sensitized region, which substance is soluble in the developing liquid, is carried out in an ammonia atmosphere.

7. The method according to claim 5, wherein the resist film is an image reverse resist.

8. The method according to claim 1, wherein the resist film formed on the thin film contains a dye.

9. The method according to claim 8, wherein said dye is an azo dye.

10. The method according to claim 1, wherein the cross-sectional shape of the thin film pattern is determined by controlling the cross-sectional shape of the resist pattern.

11. The method according to claim 10, wherein the cross-sectional shape of the resist pattern is determined by controlling the quantity of exposure light in the step of exposing the resist film selectively, and forming a photo-sensitized region in the resist film, which photo-sensitized region is soluble in a developing liquid.

12. The method according to claim 10, wherein the cross-sectional shape of the resist pattern is determined by adding a dye to the resist film and controlling the quantity of the added dye.

13. The method according to claim 1, wherein the cross-sectional shape of the thin film pattern is determined such that the dry etching is performed by RIE, the RIE is carried out by use of a parallel-plate reactor capable of independently controlling the temperature of an upper electrode and the temperature of a lower electrode, and a temperature difference, which is caused between the upper electrode and lower electrode, is controlled.

* * * * *